United States Patent
Dhindsa et al.

(10) Patent No.: US 6,432,831 B2
(45) Date of Patent: Aug. 13, 2002

(54) GAS DISTRIBUTION APPARATUS FOR SEMICONDUCTOR PROCESSING

(75) Inventors: Rajinder Dhindsa, San Jose; Fangli Hao, Cupertino; Eric Lenz, Pleasanton, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/814,972

(22) Filed: Mar. 23, 2001

Related U.S. Application Data (62) Division of application No. 09/343,690, filed on Jun. 30, 1999, now Pat. No. 6,245,192.

(51) Int. Cl.[7] .................................. H01L 21/302
(52) U.S. Cl. .................. 438/710; 438/711; 438/714; 438/715; 438/729
(58) Field of Search ................... 438/706, 711, 438/715, 729, 714, 731

(56) References Cited

U.S. PATENT DOCUMENTS

| | | | |
|---|---|---|---|
| 4,209,357 A | 6/1980 | Gorin et al. | 438/710 |
| 4,263,088 A | 4/1981 | Gorin | 438/9 |
| 4,270,999 A | 6/1981 | Hassan et al. | 204/192.32 |
| 4,297,162 A | 10/1981 | Mundt et al. | 438/729 |
| 4,534,816 A | 8/1985 | Chen et al. | 156/345 |
| 4,579,618 A | 4/1986 | Celestino et al. | 156/345 |
| 4,590,042 A | 5/1986 | Drage | 422/186.06 |
| 4,612,077 A | 9/1986 | Tracy et al. | 156/345 |
| 4,780,169 A | 10/1988 | Stark et al. | 156/345 |
| 4,854,263 A | 8/1989 | Chang et al. | 118/715 |
| 5,006,220 A | 4/1991 | Hijikata et al. | 204/298.33 |
| 5,013,398 A | 5/1991 | Long et al. | 438/714 |
| 5,074,456 A | 12/1991 | Degner et al. | 228/121 |
| 5,134,965 A | 8/1992 | Tokuda et al. | 118/723 MW |
| 5,423,936 A | * 6/1995 | Tomita et al. | 156/345 |

(List continued on next page.)

FOREIGN PATENT DOCUMENTS

| | | |
|---|---|---|
| EP | 0 835 950 A1 | 4/1998 |
| JP | 63-262469 | 10/1988 |
| JP | 04-056770 A | 2/1992 |
| JP | 11-054440 A | 2/1999 |

OTHER PUBLICATIONS

Notification of Transmittal of International Preliminary Examination Report dated Aug. 27, 2001 for PCT/US00/16147, International Filing Date Jun. 12, 2000, Priority Date Jun. 30, 1999.

Primary Examiner—Benjamin L. Utech
Assistant Examiner—Binh X. Tran
(74) Attorney, Agent, or Firm—Burns, Doane, Swecker & Mathis, LLP (57) ABSTRACT

A gas distribution system for uniformly or non-uniformly distributing gas across the surface of a semiconductor substrate. The gas distribution system includes a support plate and a showerhead which are secured together to define a gas distribution chamber therebetween. A baffle assembly including one or more baffle plates is located within the gas distribution chamber. The baffle arrangement includes a first gas supply supplying process gas to a central portion of the baffle chamber and a second gas supply supplying a second process gas to a peripheral region of the baffle chamber. Because the pressure of the gas is greater at locations closer to the outlets of the first and second gas supplies, the gas pressure at the backside of the showerhead can be made more uniform than in the case with a single gas supply. In one arrangement, the first and second gas supplies open into a plenum between a top baffle plate and a temperature controlled support member wherein the plenum is divided into the central and peripheral regions by an O-ring. In a second arrangement, the first gas supply opens into the central region above an upper baffle plate and the second gas supply opens into the periphery of a plenum between the upper baffle plate and a lower baffle plate.

17 Claims, 6 Drawing Sheets

U.S. PATENT DOCUMENTS

| | | | |
|---|---|---|---|
| 5,472,565 A | 12/1995 | Mundt et al. | 216/71 |
| 5,494,713 A | 2/1996 | Ootuki | 427/579 |
| 5,529,657 A | 6/1996 | Ishii | 156/345 |
| 5,534,751 A | 7/1996 | Lenz et al. | 315/111.71 |
| 5,569,356 A | 10/1996 | Lenz et al. | 438/729 |
| 5,593,540 A | 1/1997 | Tomita et al. | 438/710 |
| 5,595,627 A | 1/1997 | Inazawa et al. | 438/715 |
| 5,614,055 A | 3/1997 | Fairbairn et al. | 156/345 |
| 5,716,485 A | 2/1998 | Salimian et al. | 156/345 |
| 5,736,457 A | 4/1998 | Zhao | 438/624 |
| 5,746,875 A | 5/1998 | Maydan et al. | 156/345 |
| 5,820,723 A | 10/1998 | Benjamin et al. | 156/345 |
| 5,834,371 A * | 11/1998 | Ameen et al. | 438/656 |
| 5,888,907 A * | 3/1999 | Tomoyasu et al. | 438/714 |
| 6,156,151 A * | 12/2000 | Komino et al. | 156/345 |
| 6,289,842 B1 * | 9/2001 | Tompa | 118/723 |

\* cited by examiner

GAS DISTRIBUTION APPARATUS FOR SEMICONDUCTOR PROCESSING

This application is a divisional, of application Ser. No. 09/343,690, filed Jun. 30, 1999, now U.S. Pat. No. 6,245,152.

FIELD OF THE INVENTION

The present invention relates to reaction chambers used for processing semiconductor substrates, such as integrated circuit wafers, and specifically to improvements in the gas distribution system used in these reaction chambers.

BACKGROUND OF THE INVENTION

Semiconductor processing includes deposition processes such as chemical vapor deposition (CVD) of metal, dielectric and semiconducting materials, etching of such layers, ashing of photoresist masking layers, etc. In the case of etching, plasma etching is conventionally used to etch metal, dielectric and semiconducting materials. A parallel plate plasma reactor typically includes a gas chamber including one or more baffles, a showerhead electrode through which etching gas passes, a pedestal supporting the silicon wafer on a bottom electrode, an RF power source, and a gas injection source for supplying gas to the gas chamber. Gas is ionized by the electrode to form plasma and the plasma etches the wafer supported below the showerhead electrode.

Showerhead electrodes for plasma processing of semiconductor substrates are disclosed in commonly assigned U.S. Pat. Nos. 5,074,456; 5,472,565; 5,534,751; and 5,569,356. Other showerhead electrode gas distribution systems are disclosed in U.S. Pat. Nos. 4,209,357; 4,263,088; 4,270,999; 4,297,162; 4,534,816; 4,579,618; 4,590,042; 4,593,540; 4,612,077; 4,780,169; 4,854,263; 5,006,220; 5,134,965; 5,494,713; 5,529,657; 5,593,540; 5,595,627; 5,614,055; 5,716,485; 5,746,875 and 5,888,907.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

It is desirable to evenly distribute the plasma over the surface of the wafer in order to obtain uniform etching rates over the entire surface of the wafer. Current gas distribution chamber designs include multiple baffles which are optimized to uniformly distribute etching gas to achieve the desired etching effect at the wafer. However, the current baffle and showerhead electrode designs are best suited to empirical optimization for uniform gas distribution for a particular gap between the wafer and the showerhead electrode and are difficult to adjust to varying gaps between the wafer and the showerhead. In addition, conventional gas distribution designs include baffles having hundreds of openings or complex, difficult to manufacture geometries to ensure even distribution of etching gas to the backside of the showerhead electrode. When etching large, twelve-inch (300 mm) wafers, controlling the process gas to create a uniform pressure distribution across the showerhead is even more difficult. The number of openings and baffles must be increased significantly to maintain uniform distribution of the etching gas. As the number of openings in the baffles increase and the number of baffles increase, the complexity and cost to manufacture such a gas distribution apparatus increase greatly.

SUMMARY OF THE INVENTION

The present invention provides a gas distribution system which is a simple to manufacture design requiring a small number of baffle plates, while still achieving desired gas distribution delivered through a showerhead. Gas flow can be optimized for any size substrate and/or gap between the showerhead and the semiconductor substrate being processed. In addition, the present invention can improve heat transfer from a showerhead electrode to a cooled support plate, thereby creating better temperature uniformity across the electrode surface. Furthermore, the present invention can provide generally continuous electrical contact among the components of a showerhead electrode gas distribution system.

A gas distribution apparatus according to the present invention includes a support plate and a showerhead which are secured to define a gas distribution chamber. The chamber includes a baffle assembly including one or more baffle plates which can be used to achieve a desired pressure distribution across the showerhead. Multiple gas supplies provide process gas into the gas distribution chamber where the process gas flows downward through the baffle assembly and through the showerhead.

A first embodiment of the invention includes a baffle assembly having an upper baffle plate. A seal member, such as an O-ring is at an intermediate location between the upper baffle plate and the support plate. The seal member divides the space therebetween into inner and outer regions. Gas from a first gas supply directs gas into the inner region and gas from a second gas supply directs gas into the outer region. The arrangement allows different gas chemistries and/or gas pressures to be provided to the inner and outer regions. As a result, better control of gas chemistry and/or gas pressure across the substrate can be achieved by preselecting process parameters or adjusting such process parameters during processing of a substrate.

If desired, middle and/or lower baffle plates can be arranged to define three plenums. The first plenum is located between the upper and middle baffle plates. The second plenum is located between the middle and lower baffle plates, and the third plenum is located between the lower baffle plate and the showerhead. The plenums can be used to create a more uniform process gas pressure distribution across the showerhead.

In a second embodiment of the present invention the support member includes a recess in its lower side which defines the gas distribution chamber. The support member has a first gas outlet supplying a first process gas into a central area of the recess chamber and a second gas outlet supplying a second process gas into a peripheral area of the recess. Secured within the baffle chamber are an upper baffle plate and a lower baffle plate. The upper baffle plate is arranged to receive gas exclusively from the first gas supply and the lower baffle plate is arranged to receive gas exclusively from the second gas supply. A first set of gas passages in the upper baffle plate is in fluid connection with gas passages in the second baffle plate to create a set of flow-connected passages through which the first process gas passes directly from the upper baffle plate to the underside of the lower baffle plate. The second process gas flows through a second set of gas passages in the lower baffle plate to its underside adjacent the backside of the showerhead. In this arrangement, the first process gas does not mix substantially with the second process gas before flowing to the underside of the lower baffle. The space between the lower baffle and the showerhead can have spaced apart annular channels which allow the gases passing through the showerhead to be selectively controlled, e.g., to achieve uniform or nonuniform gas chemistry and/or pressure across the showerhead. Gas from both the first gas supply and the second gas supply flows through a third set of openings in the showerhead into a region spanning the substrate.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENTS

For a better understanding of the invention, the following detailed description refers to the accompanying drawings, wherein preferred exemplary embodiments of the present invention are illustrated and described. In addition, the reference numbers used to identify like elements in the drawings are the same throughout.

According to the present invention, process gas can be uniformly distributed from one or more gas supplies to a substrate positioned underneath a showerhead. The showerhead can be used in. any type of semiconductor processing apparatus wherein it is desired to distribute process gas over a semiconductor substrate. Such apparatus includes CVD systems, ashers, capacitive coupled plasma reactors, inductive coupled plasma reactors, ECR reactors, and the like.

Figure 1:
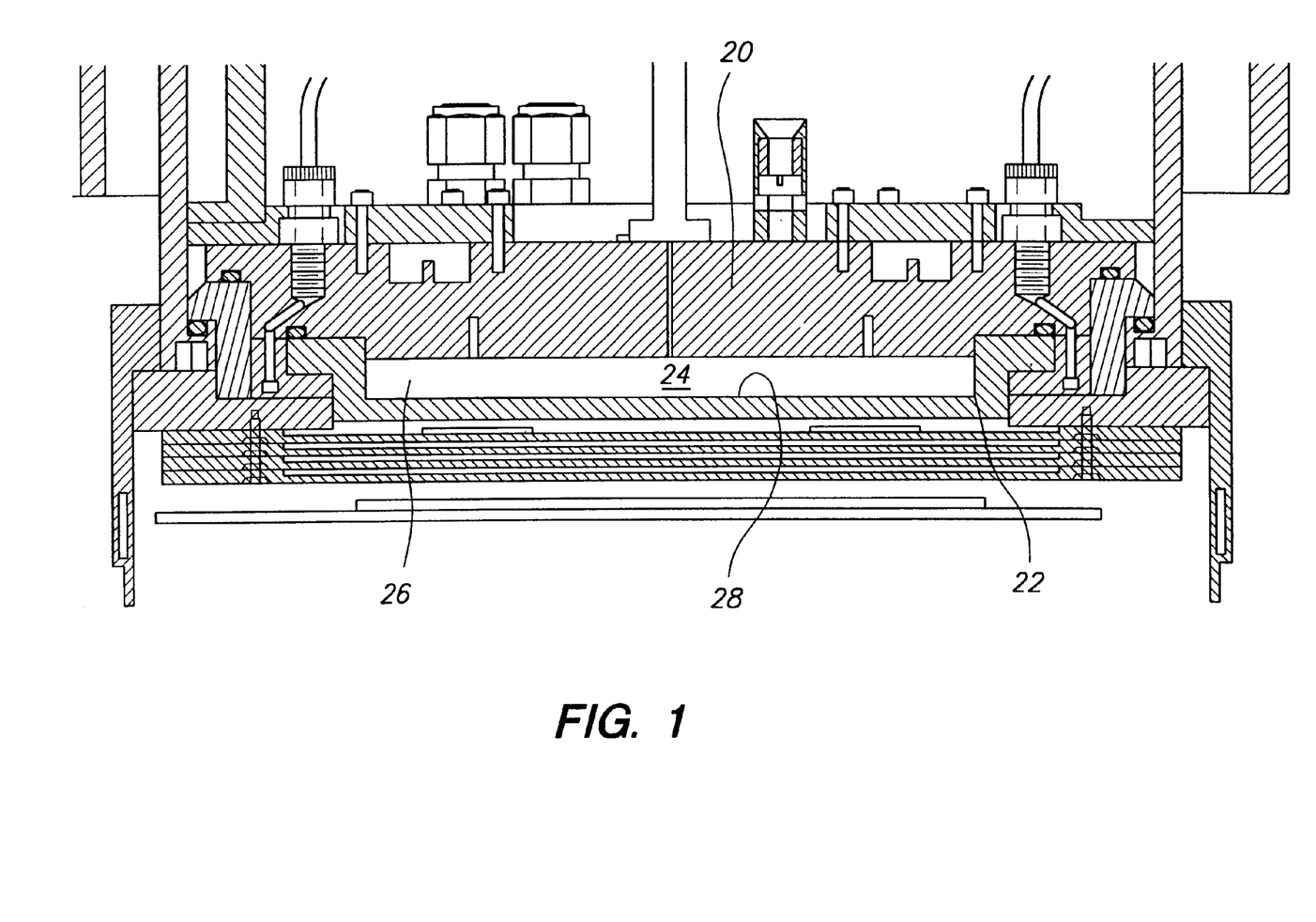
FIG. 1 is a sectional view of a gas distribution chamber according to the present invention.

A gas distribution system for a parallel plate plasma reactor is shown in FIG. 1 wherein a support plate 20 and a showerhead 22 are secured together to define a sealed gas distribution chamber 24. A baffle assembly 26, including one or more baffle plates, is located between the support plate 20 and the showerhead 22. According to the present invention, the geometry and arrangement of the baffle assembly 26 is configured to uniformly distribute gas to a backside 28 of the showerhead 22. In semiconductor wafer processes such as chemical vapor deposition or dry-etch plasma processes, the controlled distribution of process gas across the substrate is desirable in order to increase the consistency and yield of these processes.

Figure 2:
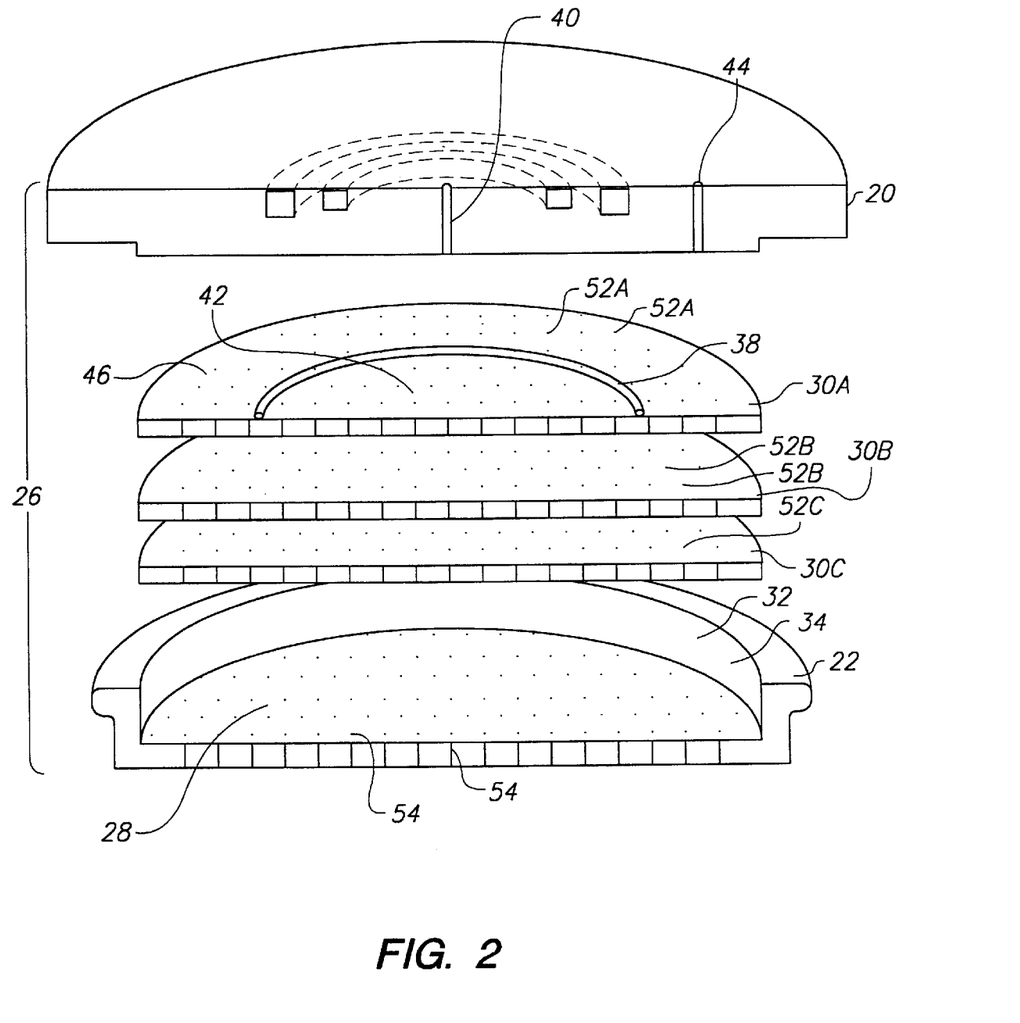
FIG. 2 is an exploded perspective sectional view of a first embodiment of the present invention.
Figure 3:
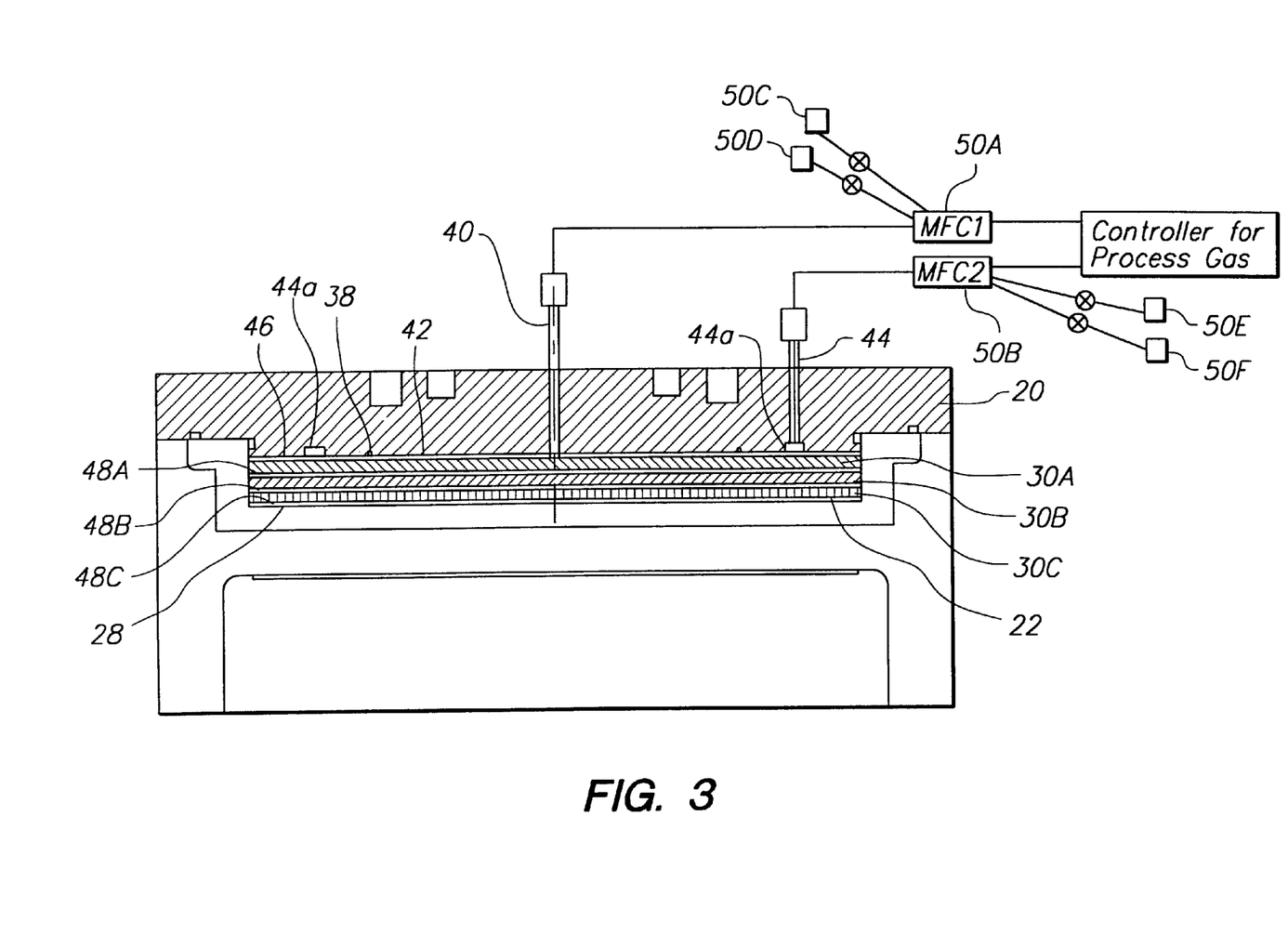
FIG. 3 is a sectional view of the first embodiment of the present invention.

As seen in FIGS. 2 and 3, in a first embodiment of the present invention the baffle assembly 26 includes baffle plate 30A and optional baffle plates 30B and 30C. The baffle plates 30A–30C, are positioned within a recess 32 defined by a peripheral upwardly-projecting side 34 of the showerhead 22. The upper baffle plate 30A is spaced from a bottom surface 36 of the support plate 20 by an O-ring 38. The O-ring 38 divides space between the upper baffle plate 30A and the support plate 20 into two regions, each of which can be supplied process gas having different gas chemistries, pressures and/or flow rates. Gas from a first gas supply 40 flows into a central region 42 between the upper baffle plate 30A and the support plate 20. Gas from a second gas supply 44 flows into an annular channel 44a and then into a peripheral region 46 between the upper baffle plate 30A and the support plate 20. The middle and bottom plates 30B, 30C can be arranged below the upper baffle plate 30A to define open plenums 48A, 48B therebetween and an open plenum 48C between the bottom baffle plate 30C and the showerhead 22.

Each gas supply creates a pressure distribution across the surface of the upper baffle plate 30A wherein the gas pressure is highest adjacent the gas supply outlet and decreases in a direction away from the outlet. Thus, the relative gas pressures between the peripheral 46 and central 42 regions of the top surface of the upper baffle plate 30A can be adjusted using first and second mass flow controllers 50A, 50B which are connected to the first and second gas supplies 40, 44. Each mass flow controller 50A, 50B can be supplied a desired gas mixture by adjusting flow rates of two or more gases supplied from gas supplies 50C, 50D, 50E, 50F, etc.

Process gas is distributed across the central region 42 and peripheral region 46 between the upper baffle plate 30A and the support plate 20, and passes through openings 52A in the upper baffle plate 30A into the open plenum 48A between the upper and middle baffle plates 30A, 30B. Thereafter, gas flows downward through openings 52B in the middle baffle plate 30B into an open plenum 48B between the middle and bottom baffle plates 30B, 30C, then through openings 52C in the bottom baffle plate 30C into an open plenum 48C between the bottom baffle plate 30C and the showerhead 22, and ultimately through openings 54 in the showerhead 22 before reaching a substrate. Each time the gas enters into an open plenum, nonuniform pressure distribution is damped as any nonuniform pressure equalizes somewhat from areas of high pressure to areas of low pressure. Thus, by configuring the gas distribution system to define a plurality of plenums 48 between the baffle plates 30, a substantially uniform pressure distribution can be achieved at the backside 28 of the showerhead 22.

Figure 4:
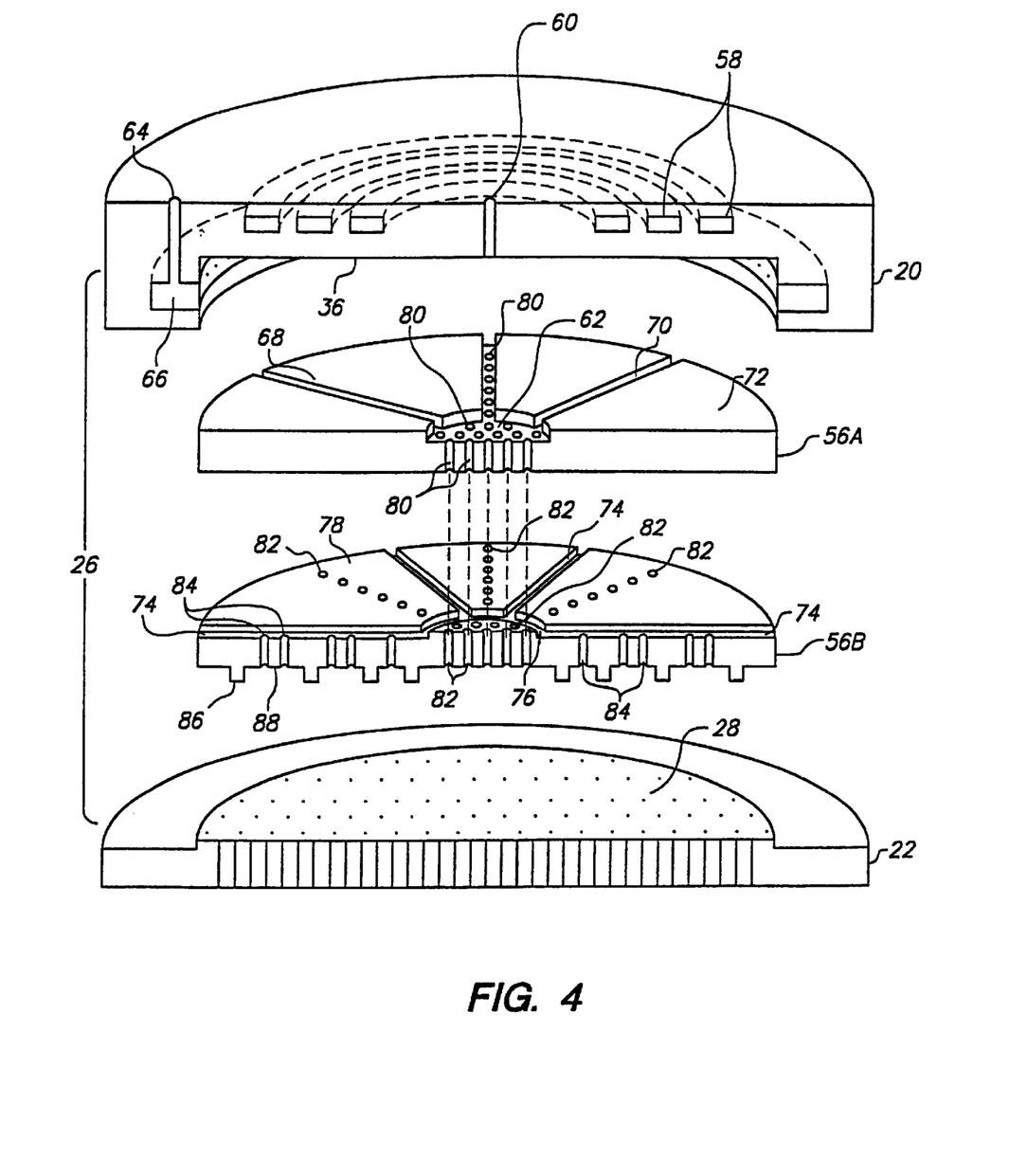
FIG. 4 is an exploded perspective view of a second embodiment of the present invention.
Figure 5:
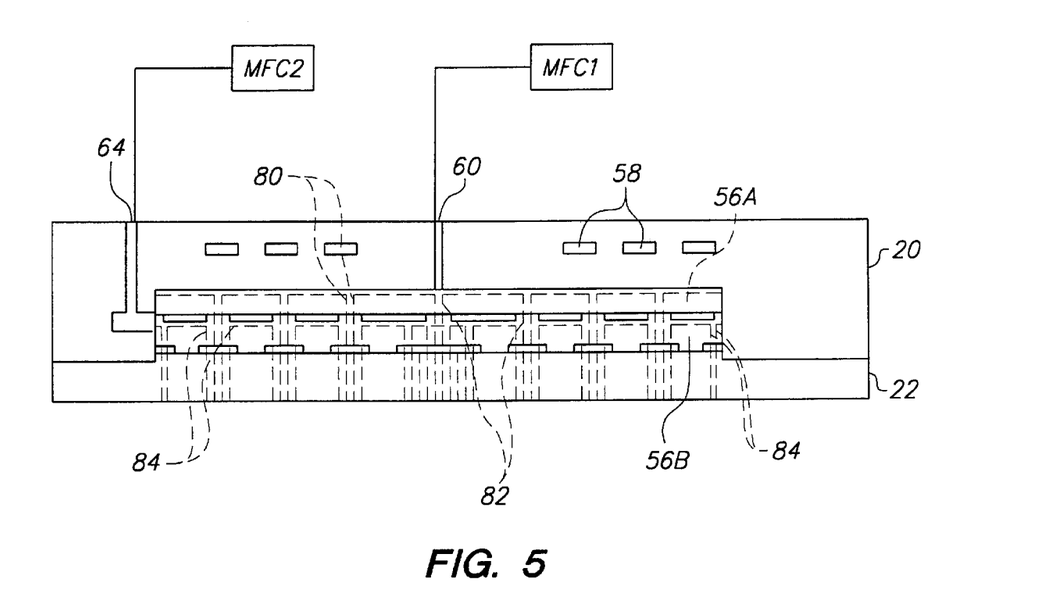
FIG. 5 is a sectional view of the second embodiment.
Figure 6:
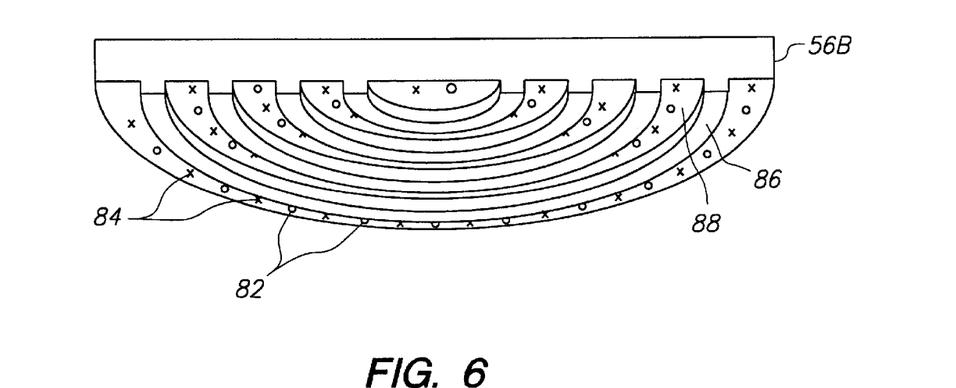
FIG. 6 is a perspective sectional view of a lower baffle plate of the second embodiment of the present invention.

A second embodiment of the gas distribution system is shown in FIGS. 4–6. The baffle assembly of the second embodiment includes two baffle plates 56A, 56B. The upper baffle plate 56A includes portions in contact with the support plate 20 and the lower baffle plate 56B includes portions in contact with the showerhead 22. Surface to surface contact between the support plate 20, baffle assembly 26 and the showerhead 22 both facilitates heat transfer between the showerhead 22, the baffle assembly 26 and the support plate 20, and can provide an electrically conductive path between the showerhead 22, baffle assembly 26 and the support plate 20 in the case where the showerhead is used as a top electrode.

During processing, the temperature controlled support plate 20 acts as a heat sink, drawing heat from the showerhead 22 through the baffle assembly 26. For instance, coolant can be circulated through cooling channels 58 in the support plate 20 to dissipate heat generated during processing of a substrate.

In the second embodiment, a first gas supply 60 is configured to feed gas to a central recess 62 in the upper baffle plate 56A. A second gas supply 64 feeds gas to an annular manifold 66 which distributes gas to a peripheral region 68 above the lower baffle plate 56B. The manifold 66 may be integral with the support plate 20 or can comprise a separate component of the gas distribution system.

The upper baffle plate 56A includes radially extending channels 70 which distribute gas from the generally centrally located first gas supply 60 to the periphery of the upper baffle plate 56A. The channels 70 are defined between contact surfaces 72 which contact the bottom surface 36 of the support plate 20. Heat and electric current flows from the upper baffle plate 56A to the support plate 20 through the surfaces 72. Similarly, the top surface of the lower baffle plate 56B includes radially extending channels 74 which distribute gas from the peripherally located manifold 66 to an annular channel 76 in a central part of the lower baffle plate 56B. The radially extending channels 74 are defined between contact surfaces 78 which thermally and electrically contact the upper baffle plate 56A. Although the channels 70, 74 and 76 are shown in the upper surfaces of the upper and lower baffles, they could also be formed in lower surfaces of the support plate 20 and upper baffle plate.

Openings 80 located in the radially extending channels 70 in the upper baffle plate are flow-connected to a first set of openings 82 in the lower baffle plate 56B. That is, the openings 80 in the upper baffle plate 56A and the first set of openings 82 in the lower baffle plate 56B define a generally continuous and uninterrupted fluid pathway from the first gas supply 60 through the upper and lower baffle plates 56A, 56B. Gas from the second gas supply 64 flows through a second set of openings 84 in the channels 74 in the lower baffle plate 56B. The flow-connected openings 80, 82 and the second set of openings 84 are arranged to prevent significant mixing between gas from the first gas supply 60 and the second gas supply 64. Such an arrangement will allow some gas to migrate between the upper and lower baffle plates. To prevent such migration, the upper and lower baffle plates could be adhesively or metallurgically bonded together in a manner which prevents the two gases from mixing together.

Preferably, the flow-connected openings 80, 82 are created by aligning the openings 80 in the upper baffle plate with the first set of openings 82 in the lower baffle plate by any suitable technique such as mating alignment features such as locating pins. However, other techniques for connecting openings 80 to openings 82 include interposition of a patterned gasket-between the upper and lower baffles or the provision of individual tubes bonded between the openings in the upper and lower baffle plates.

The bottom surface of the lower baffle plate 56B includes annular downwardly-projecting wall portions 86 which thermally and electrically contact the top surface of the showerhead 22. Both the flow-connected openings 80, 82 and the second set of openings 84 open into radially spaced annular channels 88 defined by the downwardly-projecting wall portions 86. The channels 88 could be formed in the upper surface of the showerhead or the space between the lower baffle plate and the showerhead could be an open plenum with or without contact portions therebetween for conducting heat away from the showerhead and/or supplying electrical power to the showerhead.

During semiconductor processing, gas from the first gas supply 60 flows through flow-connected openings 80, 82 in the upper baffle plate 56A and the lower baffle plate 56B, and gas from the second gas supply 64 flows through the second set of openings 84 in the lower baffle plate 56B. Gas from both the first and second gas supplies 60, 64 mixes in the channels 88 in the underside of the lower baffle plate above the top surface of the showerhead 22 and flows through a third set of openings 90 in the showerhead 22 toward the substrate.

Across the upper baffle plate 56A, gas pressure is highest near the centrally located first gas supply 60 and lowest near the periphery of the upper baffle plate 56A. Process gas flows downward through the flow-connected openings 82, 84 in the upper and lower baffle plates 56A, 56B to the open channels 88 in the underside of the lower baffle plate 56B. In operation, if the first and second gas supplies deliver gas at the same pressure, gas from the first gas supply 60 sets up a pressure distribution wherein pressure is high proximate to the center of the lower baffle plate 56B and low at the periphery of the lower baffle plate 56B whereas the gas from the second gas supply 64 sets up a pressure distribution wherein pressure is high at the periphery and low at the center-of the lower baffle. Consequently, with the baffle arrangement of the invention, the pressure seen at the backside of the showerhead can be made more uniform across the backside of the showerhead.

In an alternative processing scheme, the gas distribution system can provide a controlled, nonuniform gas pressure distribution across the backside 28 of the showerhead 22. For example, if high gas pressure around the periphery of the backside 28 of the showerhead 22 is desirable, the flow through the second gas supply 64 can be selectively increased relative to the flow through the first gas supply 60. Conversely, if relatively high gas pressure is desirable near the center of the backside 28 of the showerhead 22, the flow through the first gas supply 60 can be increased relative to the flow through the second gas supply 64. Thus, in the case of single wafer processing, the gas distribution system can supply different gas chemistries to one or more annular zones above the wafer. Because the gas chemistry, flow rate and pressure can be made uniform circumferentially around each such annular zone but varied radially from zone to zone it is possible to effect uniform processing of a wafer during processes wherein the processing conditions at the wafer surface vary across the wafer.

Figure 7A:
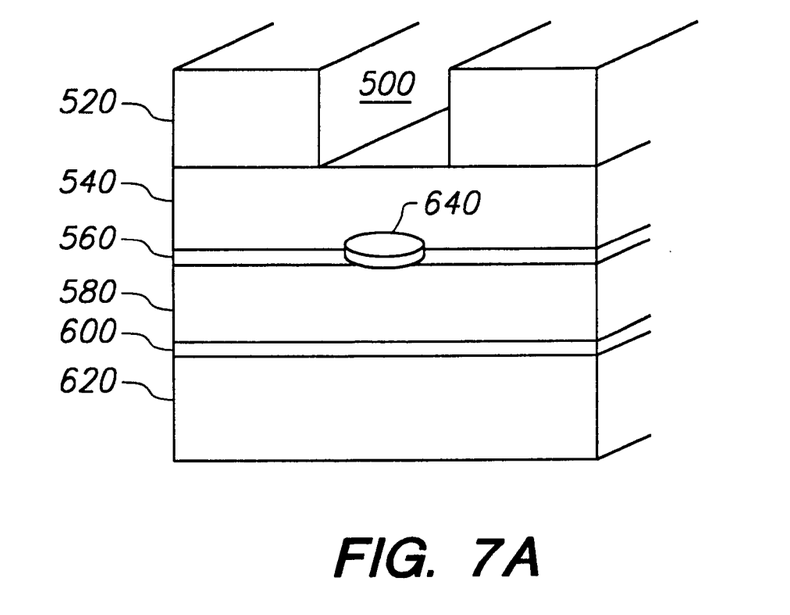
FIGS. 7A–B show an etching process which can be carried out with the gas distribution system of the invention.
Figure 7B:
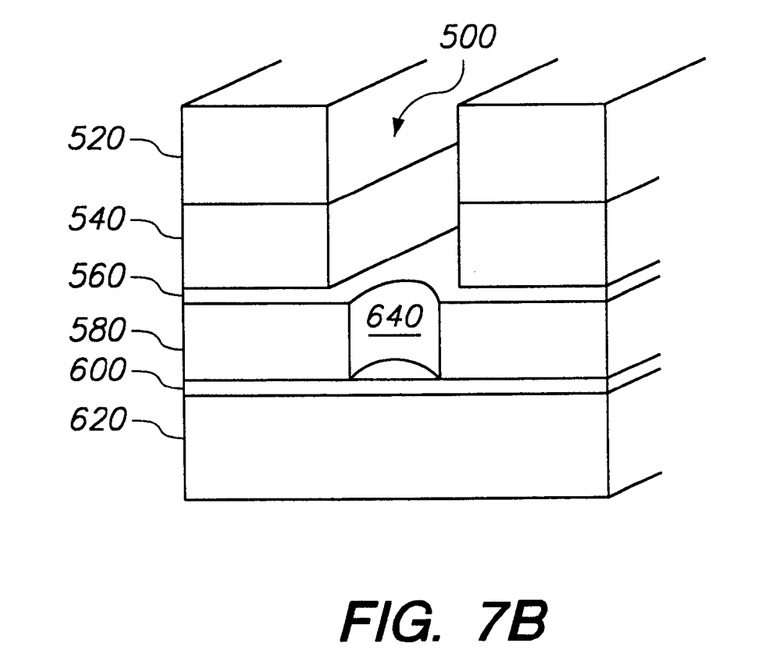

FIGS. 7A–B show schematics of how a dual-damascene structure can be etched in a single step in accordance with the invention. FIG. 7A shows a pre-etch condition wherein an opening 500 corresponding to a trench is provided in a photoresist masking layer 520 which overlies a stack of a first dielectric layer 540 such as silicon oxide, a first stop layer 560 such as silicon nitride, a second dielectric layer 580 such as silicon oxide, a second stop layer 600 such as silicon nitride, and a substrate 620 such as a silicon wafer.

In order to obtain etching of vias through the first stop layer 560 in a single etching step, first stop layer 560 includes an opening 640. FIG. 7B shows the structure after etching wherein the opening 500 extends through the dielectric layer 540 to the first stop layer 560 and the opening 640 extends through the second dielectric 580 to the second stop layer 600. Such an arrangement can be referred to as a "self-aligned dual-damascene" structure.

During the etch process, process gas conditions supplied by the first and second gas supplies in the first and second embodiments can be changed relative to each other, e.g., during etching of the trench 500 a mixture of Ar, oxygen and fluorocarbons (e.g., $CHF_3$ and $C_4F_8$) can be supplied and during etching of the vias 640 the flow of the oxygen to the central region of the wafer can be decreased. In the case of etching low-k dielectric layers, the process gas can include a hydrocarbon such as $C_2H_4$ and the hydrocarbon to oxygen gas flow rate ratio can be varied radially to achieve uniform etching. Thus, according to the invention the flow of gases to the center and edge of the wafer can be adjusted to compensate for edge fast etching and center fast etching conditions in the plasma chamber. For example, in a conventional plasma etcher, edge fast etch conditions can occur until the photoresist is eroded after which center fast etch conditions can occur. With the gas distribution apparatus according to the invention, more oxygen can be supplied in the center when the wafer has a photoresist layer whereas when the photoresist layer is eroded away, the flow of oxygen to the center can be reduced. As a result, more uniform etching can be achieved by compensating for the edge-fast and center-fast etch conditions.

The process of the invention is applicable to various plasma processes including plasma etching of various dielectric layers such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

The plasma can be a high density plasma produced in various types of plasma reactors. Such plasma reactors typically have high energy sources which use RF energy, microwave energy, magnetic fields, etc. to produce the high density plasma. For instance, the high density plasma could be produced in a transformer coupled plasma (TCP™) which is also called inductively coupled plasma reactor, an. electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference.

The present invention has been describe d with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A method of processing a substrate in a reaction chamber wherein a gas distribution system includes a support member defining a baffle chamber therein, the support member having a first gas supply opening into a central area of the baffle chamber and a second gas supply opening into a peripheral area of the baffle chamber, a baffle arrangement located in the baffle chamber such that gas from the first gas supply passes through first openings in baffle arrangement and gas from the second gas supply passes through second openings in the baffle arrangement, and a showerhead supported by the support member such that the gas passing through the first and second openings mixes together and passes through third openings in the showerhead, the method comprising:

supplying a semiconductor substrate to the reaction chamber;

supplying process gas to the first and second gas supplies such that the process gas flows through the baffle arrangement without mixing until the process gas passes through the baffle arrangement after which the mixed process gas passes through the showerhead and into an interior of the reaction chamber; and processing the semiconductor substrate with the process gas passing through the showerhead.

2. The method of claim 1, wherein the semiconductor substrate comprises a silicon wafer and the method includes dry etching a dielectric, semiconductive or conductive layer of material on the wafer.

3. The method of claim 1, wherein the method includes depositing a layer of material on the semiconductor substrate.

4. The method of claim 1, wherein the showerhead comprises a showerhead electrode and the support member comprises a temperature-controlled member, the method including withdrawing heat from the showerhead electrode by passing coolant through the temperature-controlled member.

5. The method of claim 1, wherein the baffle arrangement includes upper and lower baffle plates, the second gas supply supplies gas to one or more gas flow channels located between the upper and lower baffle plates, the gas from the second gas supply flowing through the channels in a direction from an outer region of the baffle plates towards an inner region of the baffle plates.

6. The method of claim 1, further comprising adjusting flow rate and/or gas pressure of the process gas supplied to the first gas supply and adjusting flow rate and/or gas pressure of the process gas supplied to the second gas supply such that a desired gas pressure distribution is provided across the backside of the showerhead.

7. The method of claim 1, wherein the baffle arrangement includes upper and lower baffle plates, the method further comprising cooling the showerhead by withdrawing heat from the showerhead through contacting surfaces of the showerhead, the lower baffle plate, the upper baffle plate and/or the support member.

8. The method of claim 1, wherein the process gas flowing through the first gas supply has the same gas chemistry as the process gas flowing through the second gas supply.

9. The method of claim 1, wherein the process gas flowing through the first gas supply has a different gas chemistry than the process gas flowing through the second gas supply.

10. The method of claim 1, wherein the substrate is a semiconductor wafer which is etched in at least first and second steps, the process gas passing through the first gas supply being regulated relative to the process gas passing through the second gas supply to compensate for edge-fast and center-fast etch conditions during the first and second steps.

11. The method of claim 1, wherein the showerhead is a showerhead electrode which energizes the process gas passing therethrough into a plasma state.

12. The method of claim 11, further comprising etching a layer on the semiconductor substrate by supplying RF power to the showerhead electrode such that the process gas forms a plasma in contact with an exposed surface of the semiconductor substrate.

13. The method of claim 1, wherein the baffle arrangement includes upper and lower baffle plates, the gas passing through the first and second openings mixes in radially spaced apart annular gas flow channels located between the lower baffle plate and the showerhead.

14. The method of claim 13, wherein the channels are formed in a lower surface of the lower baffle plate and/or in an upper surface of the showerhead, the lower surface of the lower baffle plate being in contact with the upper surface of the showerhead such that heat is removed from the showerhead during processing of the semiconductor substrate.

15. The process of claim 1, wherein openings are etched through exposed portions of a dielectric layer of the substrate to an electrically conductive or semiconductive layer of the substrate.

16. The process of claim 15, wherein the etching step is carried out as part of a process of manufacturing a damascene structure.

17. The process of claim 15, wherein the semiconductor substrate includes layers of a photoresist masking layer, a first dielectric layer, a first stop layer, a second dielectric layer and a second stop layer, the etching step being carried out such that a trench patterned in the photoresist layer is etched through the first dielectric layer to the first stop layer during a first stage of the etching step and vias or contact openings are etched through the second dielectric layer to the second stop layer during a second stage of the etching step, the process gas supplied by the first and second gas supplies being adjusted such that the process gas composition and/or flow rates during the first stage is different from the process gas composition and/or flow rates during the second stage.

* * * * *